United States Patent

Hansen et al.

[11] Patent Number: 6,133,749
[45] Date of Patent: Oct. 17, 2000

[54] VARIABLE IMPEDANCE OUTPUT DRIVER CIRCUIT USING ANALOG BIASES TO MATCH DRIVER OUTPUT IMPEDANCE TO LOAD INPUT IMPEDANCE

[75] Inventors: Patrick R. Hansen, Essex Junction; Harold Pilo, Underhill, both of Vt.

[73] Assignee: International Business Machines Corporation, Armonk, N.Y.

[21] Appl. No.: 09/224,764

[22] Filed: Jan. 4, 1999

[51] Int. Cl.[7] .................................................. H03K 17/16
[52] U.S. Cl. .............................. 326/30; 326/30; 326/31; 326/32; 326/33; 326/34; 326/86; 326/83; 326/87; 326/121
[58] Field of Search .................................. 326/30, 31, 32, 326/33, 34, 82, 83, 86, 87, 121

[56] References Cited

U.S. PATENT DOCUMENTS

| | | |
|---|---|---|
| 4,623,799 | 11/1986 | Nyman, Jr. . |
| 4,959,565 | 9/1990 | Knecht et al. . |
| 5,036,232 | 7/1991 | Jungert et al. . |
| 5,103,118 | 4/1992 | Peterson . |
| 5,124,579 | 6/1992 | Naghshineh . |
| 5,543,746 | 8/1996 | Kuo . |
| 5,594,373 | 1/1997 | McClure . |
| 5,596,297 | 1/1997 | McClure et al. . |
| 5,627,490 | 5/1997 | Sushihara et al. . |
| 5,635,869 | 6/1997 | Ferraiolo et al. . |
| 5,666,078 | 9/1997 | Lamphier et al. . |
| 5,811,984 | 9/1998 | Long et al. .............................. 326/30 |
| 5,898,321 | 4/1999 | Ilkbahar et al. ......................... 326/30 |
| 5,933,029 | 8/1999 | Kuroda et al. ........................... 326/30 |
| 6,025,742 | 2/2000 | Chan ....................................... 326/30 |

*Primary Examiner*—Michael Tokar
*Assistant Examiner*—Vibol Tan
*Attorney, Agent, or Firm*—Whitham, Curtis & Whitham; Robert A. Walsh, Esq.

[57] ABSTRACT

A programmable variable impedance output driver circuit uses analog biases to match driver output impedance to load input impedance. A current mirror is used to obtain a measurement of an external resistance value for matching the impedance of a driven load. The mirrored current generates the voltage "NBIAS" when passed through the resistively connected NFET. Similarly, the current is again mirrored and passed through a resistively connected PFET resulting in the voltage "PBIAS". The analog bias voltages, NBIAS and PBIAS are used to vary the impedance of complementary FETs in an impedance matched driver for a high degree of dI/dt control. The driver provides a high degree of flexibility because its turn-on and turn-off characteristics do not depend on a combination of digital control signals connected directly to the driving FETs as in the prior art. Instead, the PBIAS and NBIAS signals provide analog controls which may be applied to single transistors whose impedance changes as PBIAS and NBIAS increase or decrease.

13 Claims, 5 Drawing Sheets

VARIABLE IMPEDANCE OUTPUT DRIVER CIRCUIT USING ANALOG BIASES TO MATCH DRIVER OUTPUT IMPEDANCE TO LOAD INPUT IMPEDANCE

BACKGROUND OF THE INVENTION

1. Field of the Invention

The present invention generally relates to output driver circuits and, more particularly, to a programmable variable impedance output driver circuit which uses analog biases to match driver output impedance to load input impedance.

2. Description of the Related Art

In electronic systems, output drivers are required to drive I/O (input/output) devices and similar loads. In order to have efficient power transfer it is important that the impedance of the driver closely match the impedance of the load; the load comprising the impedance of the driven device as well as the impedance of the transmission line. Ideally, the driver impedance and the load impedance are equal. High performance output driver circuits require careful control of both current switching and output impedance characteristics. The former requirement, commonly referred to as dI/dt control, requires switching the driver on over a specified period of time, or switching multiple stages of the driver on in sequence. Such output current control techniques are necessary to minimize the on-chip inductive noise which occurs due to the large current requirements of the output driver circuits during switching. The driver impedance requirements result in "programmable impedance" drivers whose output resistance is varied using complicated digital controls. This impedance matching is necessary to avoid signal degradations due to bus reflections at high frequencies, where the output data bus acts as a transmission line. As product cycle times decrease, the current control and programmable impedance design points for an output driver must be carefully considered to avoid limiting the performance of the driver.

FIG. 1 illustrates a driver design for digitally varying the impedance of an output driver. The signals P-large, P-medium, P-small, and P-offset, control the number of PFETs, P10–P13, respectively, which are active when the driver is passing a high voltage value to the output signal node 14. Similarly, the signals N-large, N-medium, N-small, and N-offset control the number of NFETs, N20–N23, respectively, which are active when the driver is passing a low voltage value to the output signal node 14. The more FETs which are active when the output signal 14 is driven high or low, the lower the impedance of the driver. One control line 16 must be available for each FET. Each control line 16 is NANDed 26 or NORed 28 with the data signal 30 to activate the P-FET fingers or the NFET fingers, respectively. The discretization of possible driver impedance values is determined by the number of FETs. The smallest PFET and NFET dimensions available in a given technology determine the smallest impedance increments possible.

This approach has several disadvantages. First, to achieve fine impedance resolution, many FET controls must be applied to every driver, representing a significant amount of wiring. Second, any necessary dI/dt control must be implemented by staggering the switching of the FET controls. Because any binary combination of driver fingers is possible, the amount of turn-on/turn-off staggering which may occur is limited. This is true because the driver must have the same (or very nearly the same) turn-on/turn-off characteristics, independent of the programmed impedance. The only staggering which may thus occur is between an offset impedance (a FET width which must always be turned on, representing the highest possible impedance), and the remaining FET fingers. For example, in FIG. 1 the P-offset signal would switch independently before the P-large, P-medium, and P-small signals which all switch simultaneously some small amount of time later. This method provides minimal control of the switching current characteristics of the driver.

Finally, because the controls 18 are digital, they may only be changed at a time when the driver is disabled. If the controls 18 were to switch from a combination of P-large active, P-medium inactive, P-small inactive to a combination of P-large inactive, P-medium inactive, P-small active, it would be possible during that switching for all the FETs to be on or off at the same time. Such instances of large impedance changes are unacceptable when the driver is generating output. Thus a careful timing protocol is necessary between the programmable impedance control signal generation circuitry and the output driver.

SUMMARY OF THE INVENTION

It is therefore an object of the present invention to provide more precise control of dI/dt.

It is yet another object of the present invention to reduce the number of control lines necessary to vary the impedance of the driver circuit.

It is yet another object of the present invention to eliminate the cumbersome timing control circuitry in a variable impedance driver.

According to the invention, an impedance evaluation circuit comprises a current mirror used to obtain a measurement of an external resistance value for matching the impedance of a driven load. The impedance evaluation circuit selects several of "n" PFETs, referred to as "FET fingers" using a binary combination of available control signals. The selected PFET fingers control a current mirror to determine the amount of current through the external resistor. Level comparison circuitry increments binary control signals until a feedback loop signal measuring a voltage across the external resistor reaches a value of Vd dq/2. At this point, the current through the external resistor is the amount (or multiple thereof) of current which an impedance matched driver must deliver to a transmission line when driving a load. The current mirror then mirrors the current through the resistor. A differential amplifier at the center of the current mirror is used to improve current mirroring. The mirrored current generates the voltage "NBIAS" when passed through the resistively connected NFET. Similarly, the current is again mirrored and passed through a resistively connected PFET resulting in the voltage "PBIAS". The analog bias voltages, NBIAS and PBIAS generated by the described control circuitry are used to vary the impedance of complementary FETs in an impedance matched driver for a high degree of dI/dt control. The driver provides a high degree of flexibility because its turn-on and turn-off characteristics do not depend on a combination of digital control signals connected directly to the driving FETs. Instead, the PBIAS and NBIAS signals provide analog controls which may be applied to single transistors comprising the driving FETs. The resistivity of these devices changes as PBIAS and NBIAS increase or decrease. For the driver PFETs, as PBIAS decreases, the driver pull-up impedance decreases and as PBIAS increases, the impedance increases. Similarly, as NBIAS decreases, the driver pull-down impedance increases and as NBIAS increases, the impedance decreases.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 2:
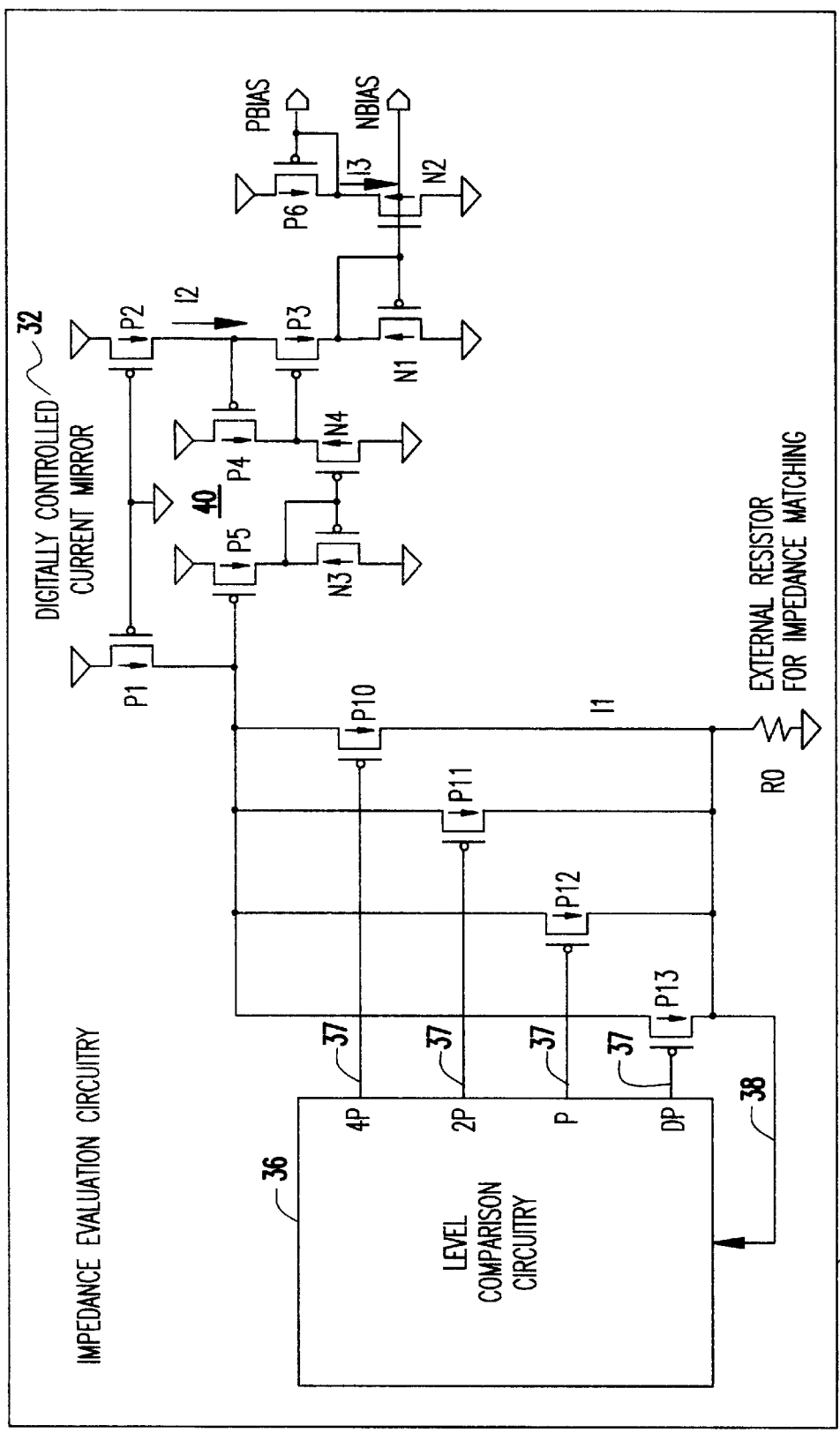
FIG. 2 is a programable current mirror circuit according to the present invention.

Referring now to the drawings, and more particularly to FIG. 2, there is shown an impedance evaluation circuit 31 according to the present invention wherein a digitally controlled current mirror 32 is used to obtain a measurement of an external resistance value $R_Q$ 34 for matching the impedance of a driven load. The current mirror 32 comprises two back-to-back PFET transistors, P1 and P2, connected at their gates to ground and their drains connected to a supply voltage. With this arrangement, the current I1 flowing through P1 in a first leg of the current mirror matches the current I2 flowing in P2, a second leg of the current mirror, provided P1–and P2 have identical characteristics. The level comparison circuitry 36 selects several of "n" PFET fingers P10–P13 using a binary combination of the available control signals. The selected PFET fingers P10–P13 combine with P1 of the current mirror 32 to determine the amount of current I1 through the external resistor $R_Q$ 34. The level comparison circuitry 36 increments the binary control signals 37 until a feedback loop signal 38 measuring the voltage across $R_Q$ 34 reaches a value of Vddq/2. At this point, the current through the external resistor $R_Q$ 34 is the amount (or multiple thereof) of current which an impedance matched driver must deliver to a transmission line when driving the load. The current I1 is then mirrored through P2 and a serially connected PFET P3 such that a mirrored current I2 matches or is a multiple of current I1. A differential amplifier 40 comprising P4, P5, N3, and N4, at the center of the digital current mirror 32 provides a feedback network which ensures that a voltage V2 across P2 very closely matches V1. This technique improves the matching of I1 and I2. The current I2 generates the voltage 'NBIAS' when passed through the resistively connected NFET N1. I2 is again mirrored through Pb and N2 to produce current I3, resulting in the voltage 'PBIAS' at the gate of Pb.

Figure 1:
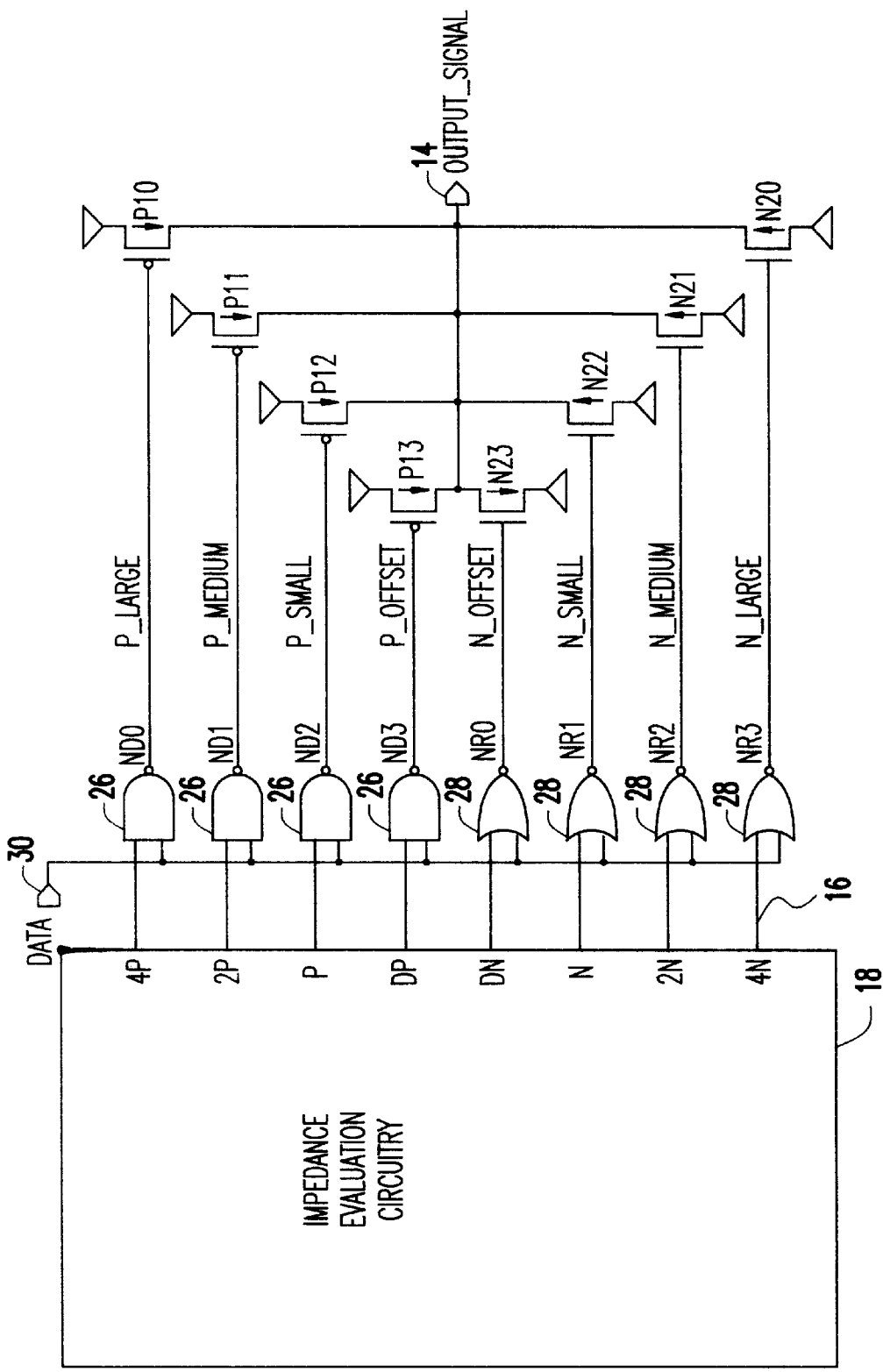
FIG. 1 is a prior art variable impedance output driver circuit.

The proposed impedance evaluation circuitry 31 generates not a binary combination of control signals (as in prior art FIG. 1), but two analog bias voltages, PBIAS and NBIAS. These bias voltages match the resistance of the driver devices to an external resistor using current mirroring techniques.

Figure 3:
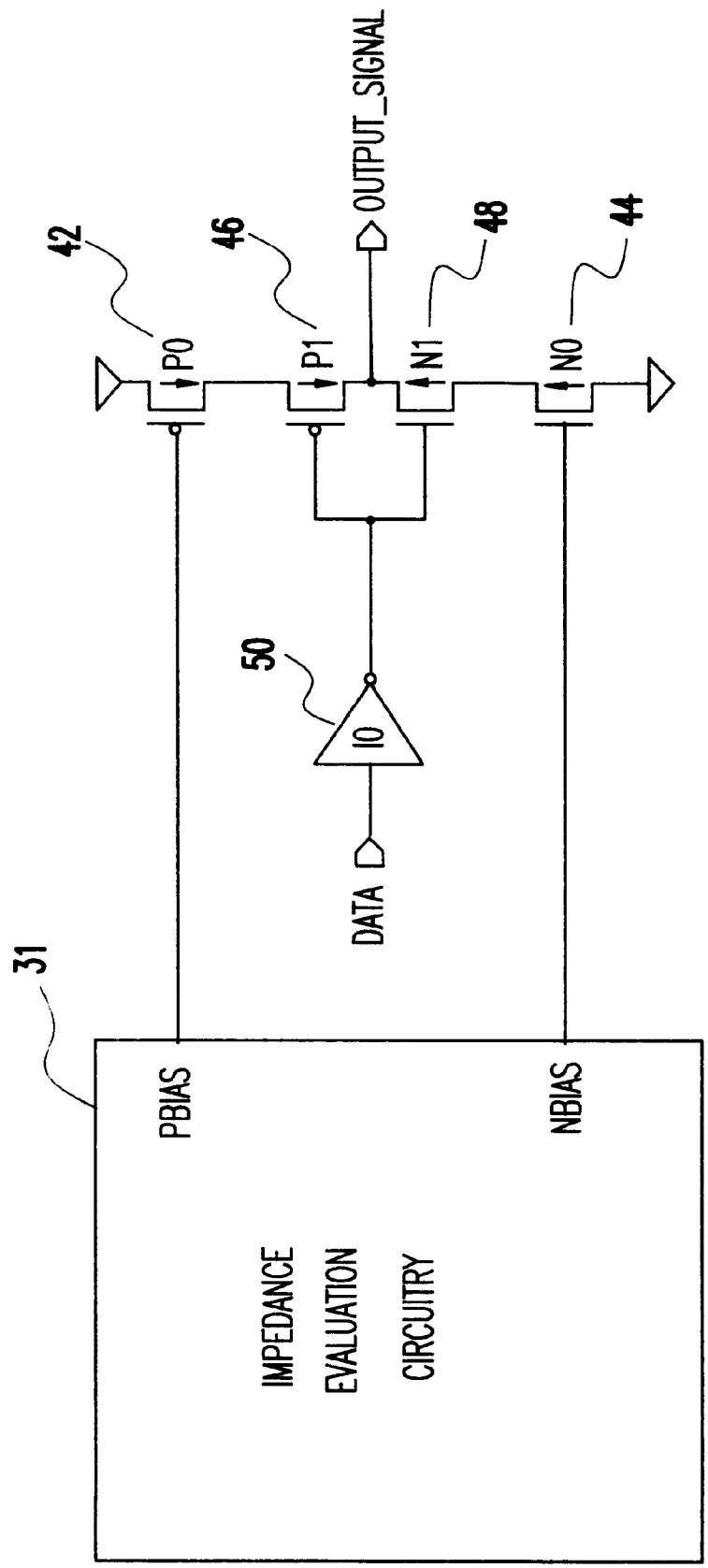
FIG. 3 is a variable impedance output driver circuit having an output impedance varied by the programmable current mirror shown in FIG. 2.

Referring now to FIG. 3 there is shown a first impedance matched driver circuit 40 driven by the analog bias voltages PBIAS and NBIAS generated by the described impedance evaluation circuitry 31. The driver provides a high degree of flexibility because its turn-on and turn-off characteristics do not depend on a combination of digital control signals connected directly to the driving FETs, as in FIG. 1. Instead, the PBIAS and NBIAS signals provide analog controls which may be applied to single transistors 42 and 44, respectively. The resistivity of these devices changes as PBIAS and NBIAS increase or decrease. For the driver PFETs 42, as PBIAS decreases, the driver pull-up impedance decreases and as PBIAS increases, the impedance increases. Similarly, for the driver NFETs 44, as NBIAS decreases, the driver pull-down impedance increases and as NBIAS increases, the impedance decreases. Since these analog voltages are always applied to the outer stacked FET devices, 42 and 44, to achieve impedance control, the inner stacked FET devices, 46 and 48, receiving a complement of the drive data signal via inverter 50, are be used for dI/dt control.

Figure 4:
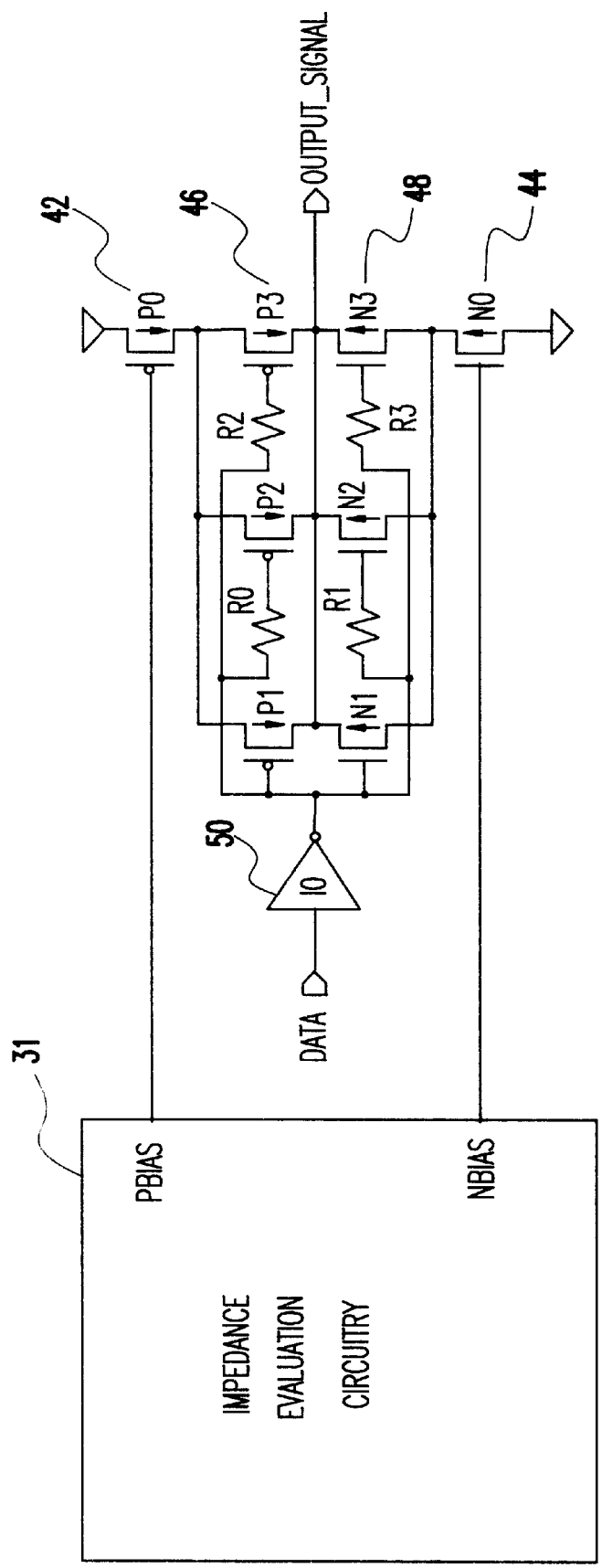
FIG. 4 is a second variable impedance output driver circuit having an output impedance varied by the programmable current mirror shown in FIG. 2.

Referring now to FIG. 4, there is shown a second possible impedance matched driver circuit controlled by the PBIAS and NBIAS signals of the present invention which allows more flexible dI/dt control in the driver. The turn-on timings of PFET devices P1, P2, and P3 are staggered by an RC delay of the inverted DATA signal due to the resistors R0–R3. This RC-staggering would be difficult to implement in device of FIG. 1 because of the number of control signals and the varying number of active output devices in the drive. Every PFET in FIG. 4 is active when driving a '1'. Similarly, every NFET in FIG. 4 is active when driving a '0'. This is not necessarily the case for the driver in FIG. 1.

Figure 5:
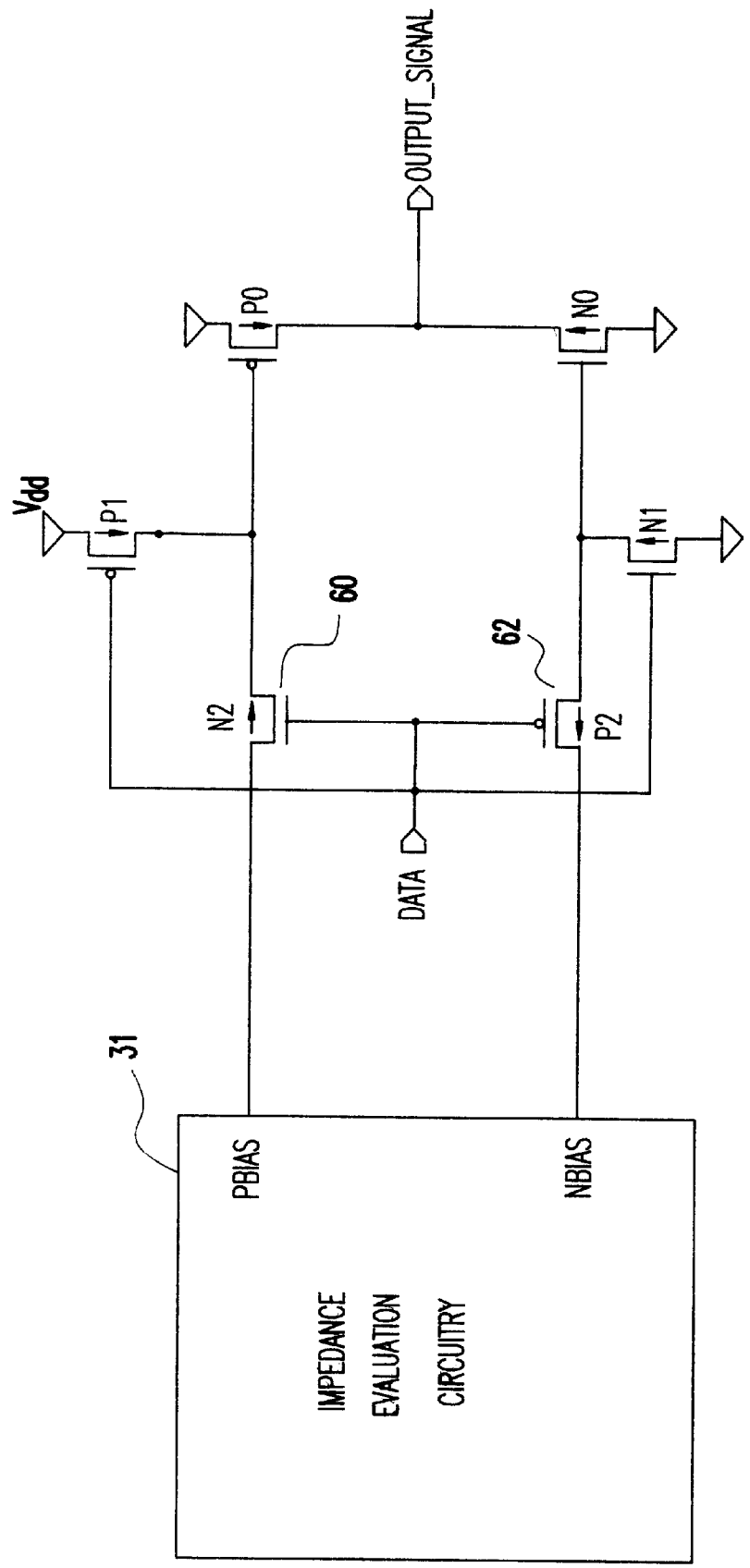
FIG. 5 is a third variable impedance output driver circuit having an output impedance varied by the programmable current mirror shown in FIG. 2.

FIG. 5 shows another possible driver using the bias generating impedance evaluation circuitry. This implementation avoids stacking output devices by placing pass transistors N2 and P2 in series with the bias voltages. The drawing shows single pass devices, but could also use complementary pass devices. To drive a '1', the DATA signal would be high, making NFETs N1 and N2 active while turning off PFETs P1 and P2. The gate of P0 is thus discharged to the voltage of PBIAS. The gate of N0 is pulled all the way to ground. To drive a "0" the DATA signal would be low, NFETs N1 and N2 inactive while turning on PFETs P1 and P2. The gate of N0 is thus discharged to the voltage of NBIAS. The gate of P0 is pulled all the way to Vdd. The OUTPUT SIGNAL node might commonly have some passive resistance in series with the active devices. FIG. 5 is provided to emphasize that this impedance matching method need not be limited to stacked driver topologies.

While the invention has been described in terms of a single preferred embodiment, those skilled in the art will recognize that the invention can be practiced with modification within the spirit and scope of the appended claims.

We claim:

1. An impedance matching circuit for matching an output driver impedance to a load input impedance, comprising:
    switching means for controlling a current through an impedance element representative of a load impedance to be driven;
    comparator for monitoring a voltage across said impedance element to determine when the current through said impedance element is representative of a current required to drive the load;
    a current mirror for mirroring a current through said impedance element; and
    bias transistors resistively connected to receive said mirrored current to produce analog bias signals for controlling an output impedance of a connected output driver.

2. An impedance matching circuit for matching an output driver impedance to a load input impedance as recited in claim 1 wherein bias transistors comprises an NFET for producing an NBIAS signal and a PFET for producing a PBIAS signal.

3. An impedance matching circuit for matching an output driver impedance to a load input impedance as recited in claim 2 wherein said output driver comprises:
- a PFET connected to a supply voltage for receiving said PBIAS signal at its gate;
- an NFET connected to ground for receiving said NBIAS signal at its gate; and
- a complementary pair of FETS serially connected between said PFET and said NFET for receiving a complement of said driven signal;
- wherein as PBIAS decreases, the driver pull-up impedance decreases, and as PBIAS increases, the impedance increases,
- and wherein as NBIAS decreases, the driver pull-down impedance increases and as NBIAS increases, the impedance decreases.

4. An impedance matching circuit for matching an output driver impedance to a load input impedance as recited in claim 3 wherein said complementary pair of FETS comprises a plurality of said complementary pairs connected in parallel and further comprises:
- a resistor connected to gate inputs of said complementary pairs for causing a switching time of each pair to be delayed by a resistive-capacitive (RC) time constant.

5. An impedance matching circuit for matching an output driver impedance to a load input impedance as recited in claim 2 wherein said output driver comprises:
- a first pass transistor for passing said PBIAS signal according to a data value;
- a second pass transistor for passing said NBIAS signal according to a data value;
- a PFET connected between a supply voltage and said PBIAS signal activated by said data value;
- an NFET connected between ground and said NBIAS signal activated by said data value; and
- a complementary pair serially connected between said supply voltage, an output node, and ground and having gates connected to receive said PBAIS and said NBIAS signals passed from said first and second pass transistors.

6. An impedance matching circuit for matching an output driver impedance to a load input impedance as recited in claim 1 further comprising a differential amplifier connected to said current mirror.

7. An impedance matching circuit for matching an output driver impedance to a load input impedance as recited in claim 1 wherein said impedance element is an externally connected resistor.

8. An impedance matching circuit for matching an output driver impedance to a load input impedance as recited in claim 1 wherein said switching means comprises a plurality of FET devices connected in parallel.

9. An impedance matching circuit for matching an output driver impedance to a load input impedance, comprising:
- switching means for controlling a current through an impedance element representative of a load impedance to be driven;
- comparator for monitoring a voltage across said impedance element to determine when the current through said impedance element is representative of a current required to drive the load;
- a current mirror for mirroring a current through said impedance element;
- a differential amplifier connected in a feedback loop to said current mirror;
- a first bias transistor resistively connected to receive said mirrored current to produce a first analog bias signal for controlling an output impedance of a connected output driver;
- a second current mirror for mirroring second current through said impedance element; and
- a second bias transistor resistively connected to receive said second mirrored current to produce a second analog bias signal, complementary of said first analog bias signal, for controlling an output impedance of a connected output driver.

10. An impedance matching circuit for matching an output driver impedance to a load input impedance as recited in claim 9 wherein bias transistors comprises an NFET for producing an NBIAS signal and a PFET for producing a PBIAS signal.

11. An impedance matching circuit for matching an output driver impedance to a load input impedance as recited in claim 10 wherein said output driver comprises:
- a PFET connected to a supply voltage for receiving said PBIAS signal at its gate;
- an NFET connected to ground for receiving said NBIAS signal at its gate; and
- a complementary pair of FETS serially connected between said PFET and said NFET for receiving a complement of said driven signal;
- wherein as PBIAS decreases, the driver pull-up impedance decreases, and as PBIAS increases, the impedance increases, and wherein as NBIAS decreases, the driver pull-down impedance increases and as NBIAS increases, the impedance decreases.

12. An impedance matching circuit for matching an output driver impedance to a load input impedance as recited in claim 11 wherein said complementary pair of FETS comprises a plurality of said complementary pairs connected in parallel and further comprises:
- a resistor connected to gate inputs of said complementary pairs for causing a switching time of each pair to be delayed by a resistive-capacitive (RC) time constant.

13. An impedance matching circuit for matching an output driver impedance to a load input impedance as recited in claim 10 wherein said output driver comprises:
- a first pass transistor for passing said PBIAS signal according to a data value;
- a second pass transistor for passing said NBIAS signal according to a data value;
- a PFET connected between a supply voltage and said PBIAS signal activated by said data value;
- an NFET connected between ground and said NBIAS signal activated by said data value; and
- a complementary pair serially connected between said supply voltage, an output node, and ground and having gates connected to receive said PBAIS and said NBIAS signals passed from said first and second pass transistors.

* * * * *